United States Patent
Kong et al.

(10) Patent No.: US 7,643,340 B2
(45) Date of Patent: Jan. 5, 2010

(54) METHOD AND APPARATUS FOR PROGRAMMING MULTI LEVEL CELL FLASH MEMORY DEVICE

(75) Inventors: Jae-Phil Kong, Hwaseong-si (KR); Jae-Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 43 days.

(21) Appl. No.: 11/946,228

(22) Filed: Nov. 28, 2007

(65) Prior Publication Data

US 2008/0068885 A1 Mar. 20, 2008

Related U.S. Application Data

(63) Continuation-in-part of application No. 11/453,991, filed on Jun. 16, 2006, now Pat. No. 7,447,067.

(30) Foreign Application Priority Data

Jan. 8, 2007 (KR) ...................... 10-2007-0002103

(51) Int. Cl.
*G11C 16/04* (2006.01)

(52) U.S. Cl. ............................. 365/185.03; 365/185.18; 365/185.22; 365/185.23

(58) Field of Classification Search ............. 365/185.03, 365/185.18, 185.22, 185.23
See application file for complete search history.

(56) References Cited

U.S. PATENT DOCUMENTS

| 5,717,632 | A | * | 2/1998 | Richart et al. ............. 365/185.2 |
| 5,943,260 | A | | 8/1999 | Hirakawa |
| 6,363,010 | B2 | | 3/2002 | Tanaka et al. |
| 6,426,892 | B2 | | 7/2002 | Shibata et al. |
| 6,529,405 | B2 | * | 3/2003 | Chang ................... 365/185.03 |
| 6,836,431 | B2 | | 12/2004 | Chang |
| 7,082,056 | B2 | | 7/2006 | Chen et al. |
| 7,224,614 | B1 | | 5/2007 | Chan |
| 7,251,160 | B2 | | 7/2007 | Li et al. |
| 7,304,881 | B2 | * | 12/2007 | Rodriguez et al. .......... 365/145 |
| 7,310,255 | B2 | | 12/2007 | Chan |
| 2008/0068883 | A1 | * | 3/2008 | Kang et al. ............ 365/185.03 |

FOREIGN PATENT DOCUMENTS

| JP | 10241380 A | 9/1998 |
| JP | 11185491 A | 7/1999 |
| JP | 2000040382 A | 2/2000 |
| JP | 2001093288 A | 4/2001 |
| JP | 2003022683 A | 1/2003 |
| JP | 2005108303 A | 4/2005 |

(Continued)

*Primary Examiner*—Connie C Yoha
(74) *Attorney, Agent, or Firm*—Volentine & Whitt, PLLC

(57) ABSTRACT

A method of programming a selected cell in a multi-level flash memory device comprises determining whether to program an upper bit or a lower bit of a selected memory cell, detecting a current logic state of two bits of data stored in the selected memory cell, determining a target logic state for the upper or lower bit, generating a program voltage and a verify voltage for programming the upper or lower bit to the target logic state, and applying the program voltage and the verify voltage to a word line connected to the selected memory cell.

21 Claims, 13 Drawing Sheets

FOREIGN PATENT DOCUMENTS

| | | |
|---|---|---|
| KR | 100313557 | 10/1998 |
| KR | 1020010070086 A | 7/2001 |
| KR | 1020030002730 A | 1/2003 |
| KR | 1020040072036 A | 8/2004 |
| KR | 1020050007653 A | 1/2005 |
| KR | 1020050094569 A | 9/2005 |
| KR | 1020060052627 A | 5/2006 |

* cited by examiner

Program Order : LSB → MSB

Program Order : MSB → LSB

Program Order : LSB → MSB

Program Order : MSB → LSB

| Memory Cell Number | Cell 0 | | |
|---|---|---|---|
| Physical address | 0 | | |
| Logical address | 3n+2 | 3n+1 | 3n |
| I/O Information | I/O_0 | I/O_0 | I/O_0 |
| Page | 3rd | 2nd | 1st |

Fig. 10B

| Memory Cell Number | Cell 0 | | | |
|---|---|---|---|---|
| Physical address | 0 | | | |
| Logical address | 4n+3 | 4n+2 | 4n+1 | 4n |
| I/O Information | I/O_0 | I/O_0 | I/O_0 | I/O_0 |
| Page | 4th | 3rd | 2nd | 1st |

METHOD AND APPARATUS FOR PROGRAMMING MULTI LEVEL CELL FLASH MEMORY DEVICE

CROSS REFERENCE TO RELATED APPLICATIONS

This application is a Continuation-In-Part (CIP) to commonly assigned and co-pending U.S. patent application Ser. No. 11/453,991 filed Jun. 16, 2006 which claims priority to Korean Patent Application No. 2005-69566, filed Jul. 29, 2006, the collective subject matter of which is hereby incorporated by reference. This application claims priority to Korean Patent Application No. 10-2007-0002103, filed Jan. 8, 2007, the subject matter of which is hereby incorporated by reference in its entirety.

BACKGROUND OF THE INVENTION

1. Field of the Invention

The present invention relates generally to semiconductor memory devices. More particularly, the invention relates to a method and related circuits for programming a flash memory device having multi-level memory cells.

2. Description of the Related Art

A flash memory device is a nonvolatile data storage device capable of being electrically programmed and erased. Flash memory devices have become increasingly popular in recent years as the demand for high capacity and high-speed nonvolatile memories has continued to increase in application areas such as portable electronic devices and code memories.

Flash memory may be broadly classified into NAND type flash memory and NOR type flash memory. NOR type flash memory has a structure wherein a plurality of memory cells are connected in parallel to a bit line. NAND type flash memory has a structure wherein a plurality of memory cells are connected in series along a bit line. Because the memory cells in NOR type flash memory are connected to bit lines in parallel, NOR type flash memory allows random access to stored data. In contrast, NAND type flash memory only allows sequential access to stored data. As a result of these different cell arrangements, NOR type flash memory tends to provide faster read times than NAND type flash memory, and therefore NOR type flash memory is often used in applications requiring high read speed such as the storage of program code. On the other hand, NAND type flash memory tends to have higher integration density and higher program and erase speeds than NOR type flash memory, and therefore it is often used for applications such as long term data storage.

In an effort to improve the integration density of both NOR and NAND type flash memory devices, researchers have developed flash memory devices having memory cells capable of storing more than one bit of information. These memory cells are commonly referred to as "multi level cells" (MLC) and devices containing MLCs are referred to as MLC devices. The operation of a conventional MLC flash memory device is described below with reference to FIGS. 1 and 2.

FIG. 1 is a drawing illustrating a threshold voltage distribution for a MLC capable of storing two bits of information, i.e., a most significant bit (MSB) and a least significant bit (LSB). Referring to FIG. 1, the MLC can store the data values '11', '10', '00', and '01', by adjusting the threshold voltage of the cell in ascending order. For example, where the MLC has a first threshold voltage, the MLC stores the data value '11.' Where the MLC has a second, higher threshold voltage, the MLC stores the data value '10,' and so on. In general, the data value '11' corresponds to an erased state of the MLC, and programming of the MLC begins from the erased state.

FIG. 2A is a state transition diagram illustrating a sequence for programming data into the MLC. In FIGS. 2A and 2B, states are labeled '11', '10', '00', and '01' to correspond to states of the MLC when it stores these respective data values. These states can also be referred to as state '11', state '10' and so on. According to the state transition diagram shown in FIG. 2A, the MLC is programmed by first programming its LSB, and then programming its MSB.

A transition of the MLC from state '11' to state '10' by changing its LSB is executed through a path denoted ① in FIG. 2A. A transition of the MLC from state '11' to state '01' by changing its MSB is performed along a path denoted ③ in FIG. 2A. A transition of the MLC from state '11' to state '00' by changing both its LSB and its MSB is executed along paths denoted ① and ② in FIG. 2A. Paths ②, and ③ correspond to program procedures which are performed to program the MSB after programming the LSB. Where the LSB is programmed first and the MSB is programmed second, it is assured from the state transition diagram of FIG. 2 that the program is performed favorably.

FIG. 2B is a state transition diagram illustrating why the LSB cannot be programmed after the MSB is programmed, where the threshold voltages corresponding to the logic states of the MLC are arranged as shown in FIG. 1. First, consider a program operation wherein the MLC is programmed from state '11' to state '00'. The program operation should first change the MLC from state '11' to state '01' through a path ④ where the MSB is converted from '1' into '0'. Next, the program operation should change the MLC from state '01' to state '00' through a path ⑤ where the LSB is converted from '1' to '0'. Unfortunately, however, a MLC with the threshold voltage distributions and corresponding states shown in FIG. 1 cannot be changed from state '01' to '00' without first erasing the MLC. In other words, conventional techniques do not allow the threshold voltage of the MLC to be reliably decreased directly from the threshold voltage distribution labeled '01' to the threshold voltage distribution labeled '00'. Accordingly, where the threshold voltages are assigned to states '11', '10', '00', and '01' as shown in FIG. 1, the programming sequence where the LSB is programmed first and the MSB is programmed next must be used and not the programming sequence where the MSB is programmed first and the LSB is programmed next.

Unfortunately, the above ordering constraint on the programming sequence can have a negative impact on the overall performance of a flash memory system, since there may be cases where it is advantageous to program the MSB first and then program the LSB. For example, the ordering constraint prohibits an application from programming only the MSB and then later programming the LSB. In other words, the constraint prohibits true random access to MLCs.

SUMMARY OF THE INVENTION

In one embodiment, the invention provides a method of programming a flash memory device, the method comprising; programming a selected multi-level memory cell (MLC) with multi-bit data through a plurality of program steps defined by a program sequence, wherein the data to be stored in the selected MLC during a current program step is determined in accordance with the current data stored in the MLC and the current program step.

In another embodiment, the invention provides a flash memory device storing multi-bit data, comprising; a voltage generator configured to generate voltages for programming a multi-level memory cell (MLC) with a target threshold voltage in response to a state selection signal and apply the program voltage to the MLC, a read/write circuit configured to write data to the MLC and read current data stored in the MLC, a program controller configured to determine target data to be stored in the MLC in accordance with the current data and a program address for data to be programmed to the MLC, and generate the state selection signal for programming the MLC with the threshold voltage corresponding to the target data, wherein the program address is provided in relation to any one bit of the multi-bit data without restriction as to page data program sequence.

In another embodiment, the invention provides a method of programming a multi-bit flash memory device where multi-bit data is stored in a single multi-level memory cell (MLC), the method comprising; determining an address associated with one bit of the multi-bit data to be programmed, reading current data stored in the MLC, determining target data in accordance with the address and the current data, generating a program voltage and a verify voltage for programming the MLC to a threshold voltage corresponding to the target data, and applying the program voltage and the verify voltage to a wordline associated with the MLC, wherein the address is randomly selected to program the one bit of the multi-bit data.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings:

FIG. 10B is a table illustrating address assignment of respective pages programmed in a 4-bit MLC;

DESCRIPTION OF EXEMPLARY EMBODIMENTS

Exemplary embodiments of the invention are described below with reference to the corresponding drawings. These embodiments are presented as teaching examples, while the actual scope of the invention is defined by the claims that follow.

Figure 3:
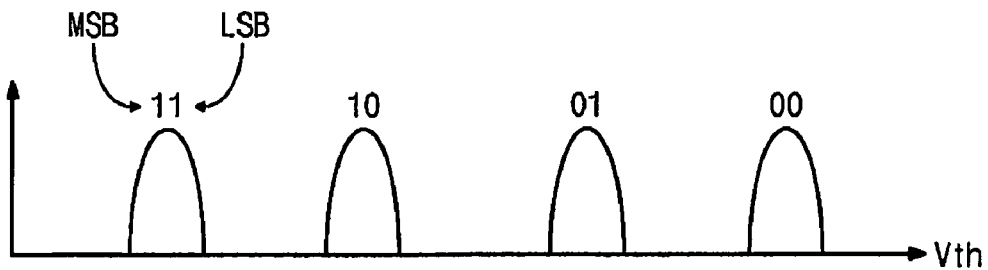
FIG. 3 is a drawing illustrating a threshold voltage distribution and corresponding state assignments for a multi-level flash memory cell according to an embodiment of the invention.

FIG. 3 is a graph illustrating a threshold voltage distribution and corresponding logic states for a multi-level flash memory cell (MLC) according to one embodiment of the present invention. Referring to FIG. 3, the threshold voltage distribution corresponds to logic states '11', '10', '01', and '00' of the MLC, where the lowest threshold voltage corresponds to state '11', the next lowest threshold voltage to state '10', the next lowest threshold voltage to state '01', and the highest threshold voltage to state '00'. The states of the MLC are arranged so that changing either the most significant bit (MSB) or the least significant bit (LSB) from a '1' to a '0' corresponds to increasing the threshold voltage of the MLC. As a result, the MLC can be programmed by either programming the LSB first and then programming the MSB, or programming the MSB first and then programming the LSB.

Figure 4A:
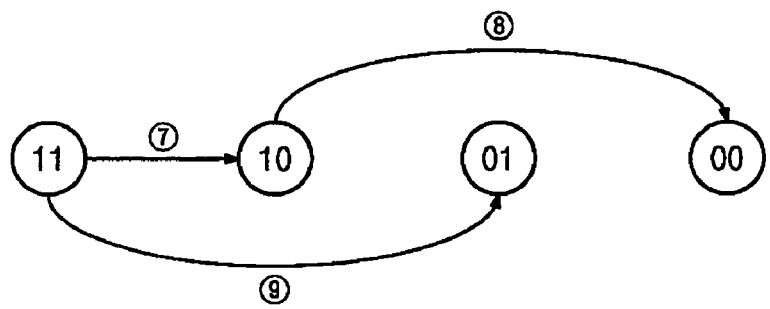
FIG. 4A is a state transition diagram for a program operation of a multi-level flash memory cell having the threshold distribution and corresponding state assignments shown in FIG. 3, wherein a LSB is programmed before a MSB.

FIG. 4A is a state transition diagram illustrating transitions taken in a program operation of a MLC having the threshold voltage distribution and state assignments shown in FIG. 3. In the program operation illustrated in FIG. 4A, the LSB of the MLC is programmed first, and then the MSB is programmed. Referring to FIG. 4A, the MLC transitions from state '11' to state '10' through a path labeled ⑦ to program the LSB. The MLC transitions from state '11' to state '01' along a path labeled ⑨ or from state '10' to state '00' along a path labeled ⑧ to program the MSB.

Figure 4B:
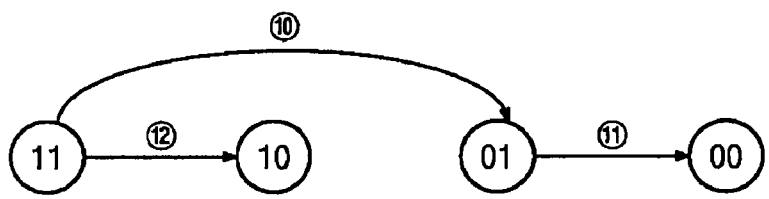
FIG. 4B is a state transition diagram for a program operation of a multi-level flash memory cell having the threshold distribution and corresponding state assignments shown in FIG. 3, wherein a LSB is programmed before a MSB.

FIG. 4B is a state transition diagram illustrating transitions taken in a program operation of a MLC having the threshold voltage distribution and state assignments shown in FIG. 3. In the program operation illustrated in FIG. 4B, the MSB of the MLC is programmed first, and then the LSB is programmed. Referring to FIG. 4B, the MLC transitions from state '11' to state '01' through a path labeled ⑩ to program the LSB. The MLC transitions from state '01' to '00' through a path ⑪ to program the LSB through, or, to program state '10', the MLC simply transitions from state '11' to '10' in one step.

Figure 1:
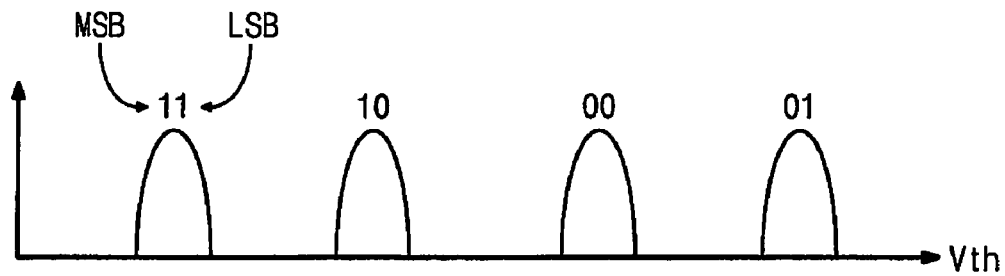
FIG. 1 is a drawing illustrating a threshold voltage distribution and corresponding state assignments for a conventional multi-level cell.
Figure 2A:
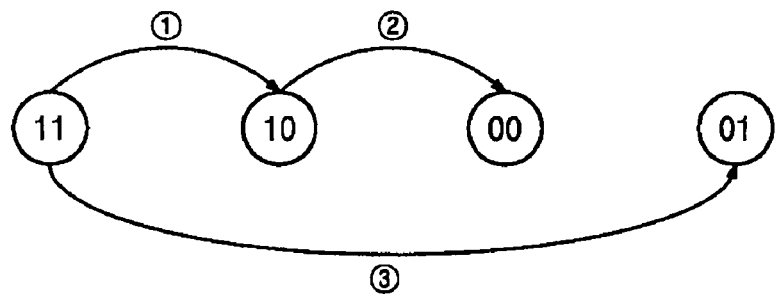
FIG. 2A is a state transition diagram for a program operation of a multi-level flash memory cell having the threshold distribution and corresponding state assignments shown in FIG. 1, wherein a least significant bit (LSB) is programmed before a most significant bit (MSB)
Figure 2B:
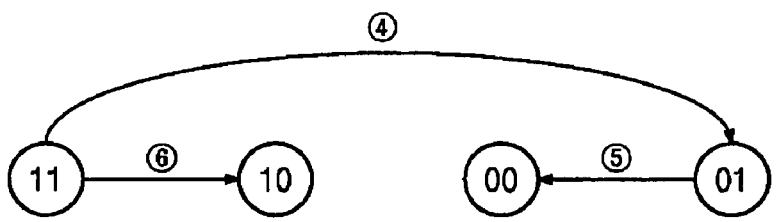
FIG. 2B is a state transition diagram for a program operation of a multi-level flash memory cell having the threshold distribution and corresponding state assignments shown in FIG. 1, wherein a MSB is programmed before a LSB.

As illustrated by FIGS. 4A and 4B, in a MLC having a threshold voltage distribution and corresponding state assignments such as those illustrated in FIG. 4 a program operation can be carried out by either programming the LSB first, and then the MSB, or programming the MSB first and then the LSB. In other words, the problem illustrated by FIGS. 2A and 2B does not occur when the states are arranged as shown in FIG. 3.

Figure 5:
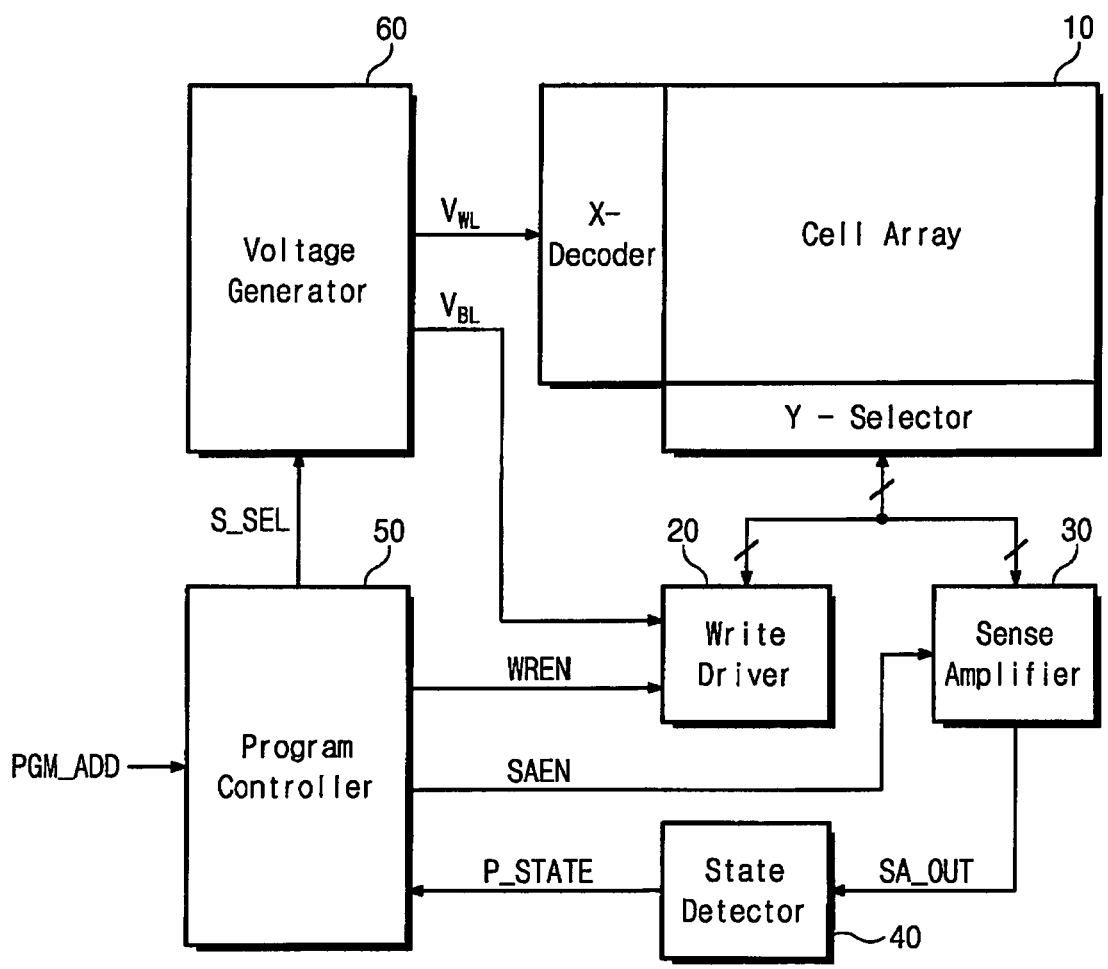
FIG. 5 is a block diagram illustrating a circuit for performing a program operation according to an embodiment of the invention.

FIG. 5 is a block diagram illustrating a flash memory device capable of programming a MLC according to the state transition diagram illustrated in FIG. 4. Referring to FIG. 5, the flash memory device comprises a memory cell array 10 having an X-decoder and a Y-selector, a write driver 20, a sense amplifier 30, a state detector 40, a program controller 50, and a voltage generator 60.

Write driver 20 drives selected bit lines with a bit line voltage $V_{BL}$ from voltage generator 60 to program selected MLCs in program operations of memory cell array 10. Sense amplifier 30 senses the logic state of selected MLCs in read and verify operations. State detector 40 receives and stores the logic state of the selected MLC from sense amplifier 30 based on a signal SA_OUT. Program controller 50 controls the overall program procedure by sensing the state of the MLC in the program operation according to a signal P_STATE from state detector 40. Voltage generator 60 generates a program voltage based on a control signal S_SEL output by program controller 50.

Memory cell array 10 preferably includes the NOR type multi-level flash memory cells and X-decoder and Y-selector for selecting the cells. Preferably, each memory cell is capable of storing two bits of data, and logic states are assigned to the respective threshold voltages of each cell such that ascending threshold voltages correspond to logic states in the following order: '11', '10', '01', and '00', as illustrated in FIG. 3.

Write driver 20 activates a bit line of a selected memory cell when a program pulse $V_{pgm}$ is applied to a word line of the memory cell as a voltage $V_{WL}$. In a program operation, write driver 20 transfers bit line voltage $V_{BL}$ from voltage generator 60 to the activated bit line in response to a write enable signal WREN input from program controller 50. Program pulse $V_{pgm}$ is transferred to the word line, and a drain of the selected memory cell is biased at bit line voltage $V_{BL}$, which is preferably 5 V, so that injection of hot electrons occurs effectively.

Sense amplifier 30 is connected in parallel to write driver 20 and bit lines of the memory cells in memory cell array 10, and senses the logic state of selected memory cells in read and verify operations. A read voltage $V_{read}$ is applied to a word line connected to a selected cell in a read operation as word line voltage $V_{WL}$, and sense amplifier 30 senses the logic state of data stored in the selected cell according to the amount of current flowing through the selected cell. In order to sense 2-bit data, sense amplifier 30 typically performs serial sensing or parallel sensing. Sense amplifier 30 then outputs output signal SA_OUT with a logic level that depends on whether current flows through the selected cell in a read operation.

State detector 40 receives output signal SA_OUT to determine the logic state of the selected cell. State detector 40 is used to facilitate the programming of a selected cell from an initial state to a target state through an intermediate state, for example, as illustrated by the program sequence shown in FIG. 3.

Program controller 50 controls the programming of the MSB or the LSB of the selected memory cell in response to a program address signal PGM_ADD input from an external source. Program controller 50 receives the signal P_STATE, which indicates the value of one data bit in a currently selected cell, and outputs control signal S_SEL, which is a state select signal used by voltage generator 60 to generate a program voltage for programming the currently selected cell into a target state.

To sense the logic state of the currently selected cell, program controller 50 outputs a sense enable signal SAEN to activate a sensing operation of sense amplifier 30. In response to sense enable signal SAEN, sense amplifier 30 performs parallel or serial sensing of the data in the currently selected memory cell.

To briefly summarize the operation of program controller 50, program controller 50 senses the logic state of one bit of a selected memory cell base on signal P_STATE. Program controller 50 then determines a target state for the selected memory cell based on program address PGM_ADD. Program controller 50 then outputs state select signal S_SEL to voltage generator 60 so that voltage generator 60 generates appropriate word line voltages for programming the selected memory cell to the target state.

Voltage generator 60 generates the voltages $V_{WL}$ and $V_{BL}$ used in the program and verify operations, and applies the voltages $V_{WL}$ and $V_{BL}$ to the word line of the memory cell array 10 and the write driver 20, respectively. Voltage $V_{WL}$, which is applied to the word line, has program voltage $V_{pgm}$ during program operations and a verify voltage $V_{veri}$ during a verify operation. Preferably, program voltage $V_{pgm}$ is applied to program the memory cells in memory cell array 10 using incremental step pulse programming (ISSP) to shift the threshold voltage of the memory cells to verify voltage $V_{veri}$ or higher.

In general, ISSP is an iterative program method that uses a repeating loop to increase the threshold voltage of a selected memory cell by increasing the voltage level of program voltage $V_{pgm}$ in a stepwise fashion. After program voltage $V_{pgm}$ is applied to a selected memory cell in ISSP, verify voltage $V_{veri}$ is applied to the selected memory cell to verify whether the cell was properly programmed. Voltage generator 60 generates program voltage $V_{pgm}$ and verify voltage $V_{veri}$ for every state '10', '01', and '00' in response to state select signal S_SEL input from program controller 50. Program voltage $V_{pgm}$ shifts the threshold voltage of the selected cell toward a desired level corresponding to a target state, and verify voltage $V_{veri}$ verifies whether or not the threshold voltage of the memory cell has been elevated to the desired level.

The start value of program voltage $V_{PGM}$ in the above described ISPP program operation of a selected cell depends on the current logic state of the selected cell. For example, the program operation uses different start values of program voltage $V_{PGM}$ when the selected cell has present states of '11', '10', and '01'. In addition, voltage generator 60 also generates bit line voltage $V_{BL}$ to be applied to a bit line connected to selected memory cell during the program operation through write driver 20.

Figure 6:
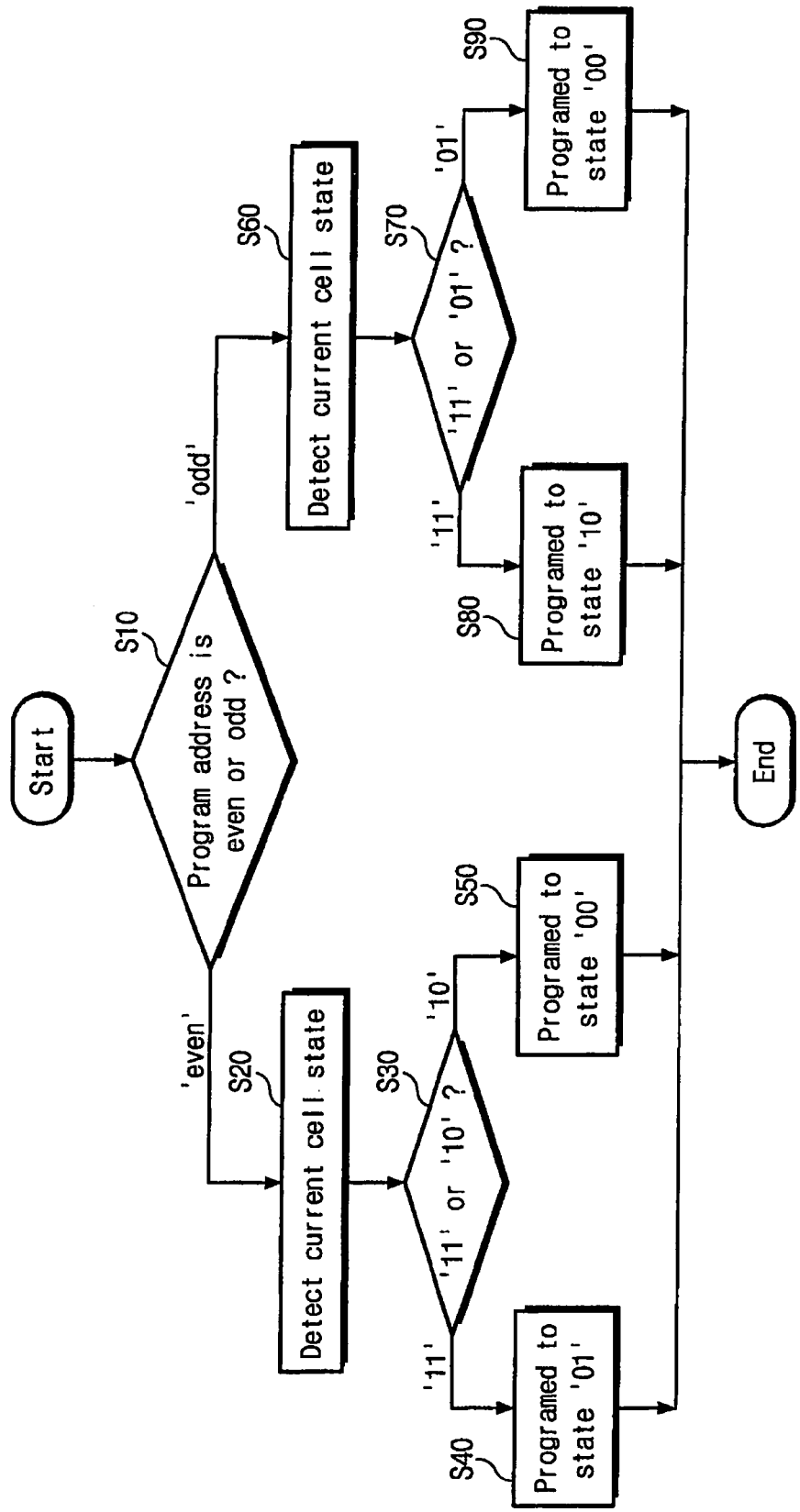
FIG. 6 is a flowchart illustrating a method of performing a program operation in a multi-level flash memory cell according to an embodiment of the invention.

FIG. 6 is a flowchart illustrating a method of programming a MLC device such as the one illustrated in FIG. 5. In the description that follows, exemplary method steps are denoted by parentheses (XXX) to distinguish them from system features such as those illustrated in FIG. 5.

Referring to FIG. 6, the method comprises first determining whether to program a MSB or a LSB of a selected cell according to program address PGM_ADD, which is typically set by a user of the MLC device (S10). If program address PGM_ADD is 'even', the MSB is programmed first, and if program address PGM_ADD is 'odd', the LSB is programmed first.

Next, the logic state of the selected cell is detected (S20 and S60). This can be accomplished, for example, by applying sense enable signal SAEN to sense amplifier 30 under the control of program controller 50. If the bit of the cell to be programmed is the MSB, it means that the MSB is in the erased state. On the other hand, if the MSB is to be programmed, the current value of the LSB may be '0' or '1', and therefore the current threshold voltage of the selected cell is checked to determine the logic state of the LSB (S20). Similarly, if the bit to be programmed is the LSB, it means that the LSB is in the erased state and the value of the MSB is unknown. Accordingly, the state of the LSB will be checked in a step (S60).

As an illustration of how the logic state of the MSB or LSB is detected, state detector 40 in FIG. 5 can be used to communicate the current value of the LSB to program controller 50 using the signal P_STATE. Based on the value of the signal P_STATE, program controller 50 determines whether the state of the selected cell is '11' or '10' (S30) or whether the state of the selected cell is '11' or '01' (S70).

If the present state of the selected cell is '11', then programming the MSB will change the selected memory cell to the state '01' (S40) and programming the LSB will change the selected memory cell to the state '10' (S80). On the other hand, if the state of the selected memory cell is '10', programming the MSB will change the logic state of the selected memory cell to state '00' (S50) and if the state of the selected memory cell is '01', programming the LSB will also change the logic state of the selected memory cell to '00' (S90).

When programming the selected memory cell from logic state '11' to logic state '00' by programming the MSB first, a state transition path such as the one illustrated in FIG. 4B should be followed. In particular, the transitions corresponding to paths ⑩ and ⑪ should be taken in a sequence. Similarly when programming the selected memory cell from logic state '11' to logic state '00' by programming the LSB first, a state transition path such as the one illustrated in FIG. 4A should be followed. In particular, the transitions corresponding to paths ⑦ and ⑧ should be taken in a sequence. Where successive program operations are required to program both the MSB and the LSB, the program operation for programming the last bit can be executed directly after verifying that the first bit is completely programmed. In other words, it is not always necessary in this case to re-check whether the cell is in state '11' or '01' when the LSB is programmed last, or to re-check whether the cell is in state '11' or '10' when the MSB is programmed last.

Once programming is completed in any of steps (S40), (S50), (S80), or (S90), a step (S100) is performed to determine whether programming of the selected cell has been completed. If yes, the method terminates. Otherwise, the method returns to step (S10).

Figures 7A, 7B:
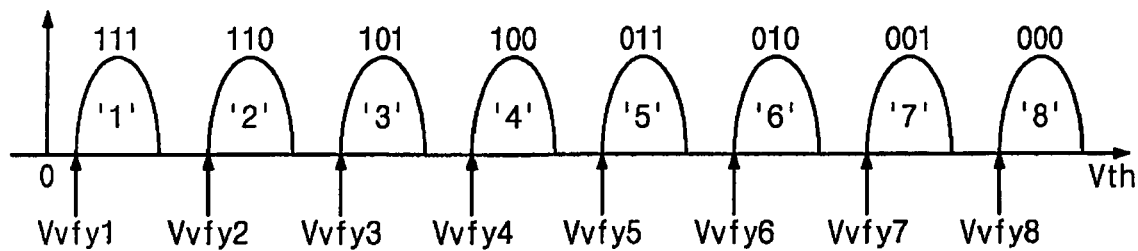
FIG. 7A is a diagram illustrating a threshold voltage distribution and corresponding state assignments for a 3-bit MLC according to the invention.
FIG. 7B is a table illustrating address assignment of respective pages programmed in a 3-bit MLC.

FIG. 7A is a diagram illustrating a threshold voltage distribution and corresponding state assignments for a 3-bit cell according to an embodiment of the invention. Referring to FIG. 7A, a multi-bit flash memory device includes a MLC storing 3-bit data. In the illustrated example, the MLC may be programmed to have one of eight discrete threshold voltages, each of which corresponds to a defined data state '1' through '8'. Each data state is assigned a corresponding 3-bit data value. For example, state '1' may be defined to correspond to a 3-bit data value of '111'. Similarly, in the illustrated example, state '2', state '3', and state '8' correspond to data values of '110', '101', and '000', respectively.

FIG. 7B conceptually illustrates address assignment information of data input to a MLC in the foregoing example. Referring to FIG. 7B, each 3-bit MLC (e.g., cell 0) is assigned a unique physical address. However, each 3-bit MLC has three corresponding logical addresses in order to uniquely program and read each of the 3 data bits associated with the MLC. That is, in the illustrated example, a first page (i.e., LSB), a second page, and a third page (i.e., MSB) correspond to logical addresses 3n, 3n+1, and 3n+2, respectively. Input/output information (I/O information) for the 3-bit MLC is associated in a corresponding manner. During a 3-bit data program operation, a MLC flash memory device according to an embodiment of the invention may alter the stored data value(s) associated with the 3-bit data by programming the first through third page data in any sequential order.

Figure 8A:
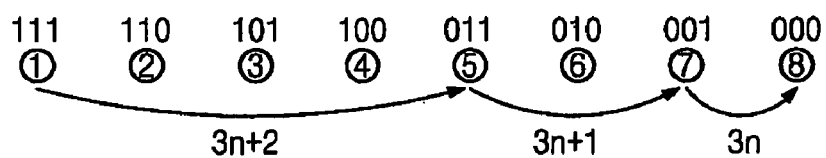
FIG. 8A is a state transition diagram illustrating a method of programming a 3-bit MLC according to one embodiment of the invention.

FIG. 8A is a state transition diagram illustrating a method of programming a 3-bit MLC according to an embodiment of the invention. In the example illustrated in FIG. 8A, one exemplary programming state transition is characterized by data associated with a third page (or MSB page) being programmed first. Thus, the illustrated state transition path moves from state '1' having a data value of '111' to state '8" having a data value of '000' through the following order: an MSB page (3n+2)→a second page (3n+1)→an LSB page (3n).

Accordingly, when the data of the MSB page (3n+2) is first programmed into the 3-bit MLC, the threshold voltage transitions from state '1' to state '5', (i.e., the data value stored by the MLC is changed from '111' to '011'). Then, when the data of the second page (3n+1) is programmed, the threshold voltage of 3-bit MLC transitions from state '5' to state '7', (i.e., the data value stored by the MLC is changed from '011' to '001'). And finally, when the data of the LSB or first page (3n) is programmed, the threshold voltage of the 3-bit MLC transitions from state '7' to state '8', (i.e., the data value stored by the MLC is changed from data '001' to '000'). In other words, given the page programming sequence assumed above, the 3-bit MLC is programmed from state '1' to state '8' through "intervening states" '5' and '7'.

Figure 8B:
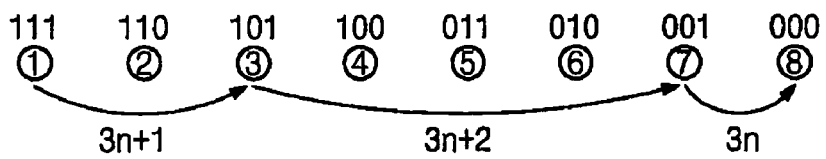
FIG. 8B is a state transition diagram illustrating a method of programming a 3-bit MLC according to another embodiment of the invention.

FIG. 8B is another state transition diagram illustrating a method of programming a 3-bit MLC according to another embodiment of the invention. In the example illustrated in FIG. 8B, an exemplary programming state transition is characterized by data associated with a second page (or 3n+1) being programmed first. Thus, the illustrated state transition path moves from state '1' to state '8' through the following order: a second page (3n+1)→an MSB page (3n+2)→an LSB page (3n).

Accordingly, when the data of the second page (3n+1) is first programmed into a 3-bit MLC, the threshold voltage transitions from state '1' to state '3', (i.e., the data value stored by the MLC is changed from '111' to '101'). Then, when the data of the third page (3n+2) is programmed, the threshold voltage of the MLC transitions from state '3' to state '7', (i.e., the data value stored by the MLC changes from '101' to '001'). And finally, when the data of the LSB or first page (3n) is programmed, the threshold voltage of the MLC transitions from state '7' to state '8' (i.e., the data value stored by the MLC is changed from '001' to '000').

Figure 8C:
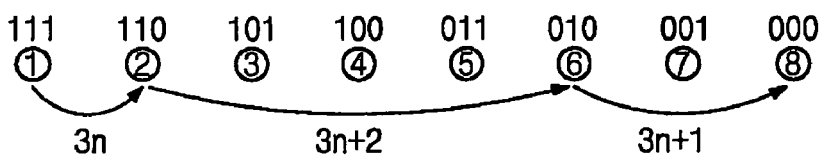
FIG. 8C is a state transition diagram illustrating a method of programming a 3-bit MLC according to still another embodiment of the invention.

FIG. 8C is a state transition diagram illustrating a method of programming a 3-bit MLC according to another embodiment of the invention. In the example illustrated in FIG. 8C, one exemplary programming state transition is characterized by data associated with the first or LSB page (or 3n) being programmed first. Thus, the illustrated state transition path moves from state '1' to state '8' through the following order: a first page (3n)→a third (MSB) page (3n+2)→a second page (3n+1).

Accordingly, when the data of the first page (3n) is programmed into a 3-bit MLC, the threshold voltage transitions from state '1' to state '2', (i.e., the data value stored by the MLC is changed from '111' to '110'). Then, when the data of the third page (3n+2) is programmed, the threshold voltage of the MLC transitions from state '2' to state '6', (i.e., the data value stored by the MLC is changed from '110' to '010'). And finally, when the data of the second page (3n+1) is programmed, the threshold voltage of the MLC transitions from state '6' to state '8', (i.e., the data value stored by the MLC is changed from '010' to '000').

Thus, as evidenced by the foregoing state transition examples, three (3) bits of data may be programmed into a single 3-bit MLC irrespective of the program sequence for associated respective data pages.

Figure 9A:
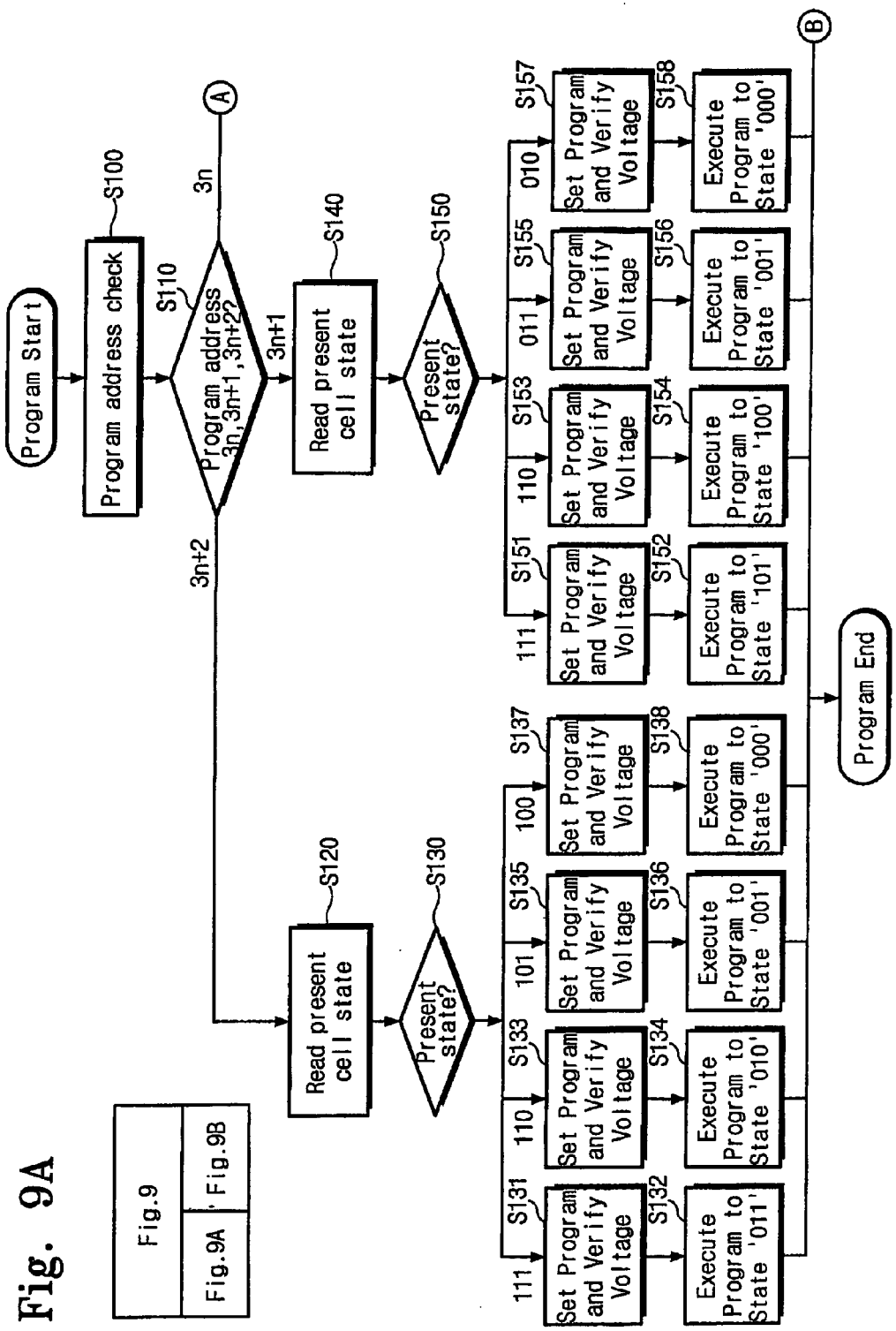
FIGS. 9A and 9B are a flowchart illustrating a method of programming a 3-bit MLC according to an embodiment of the invention.
Figure 9B:
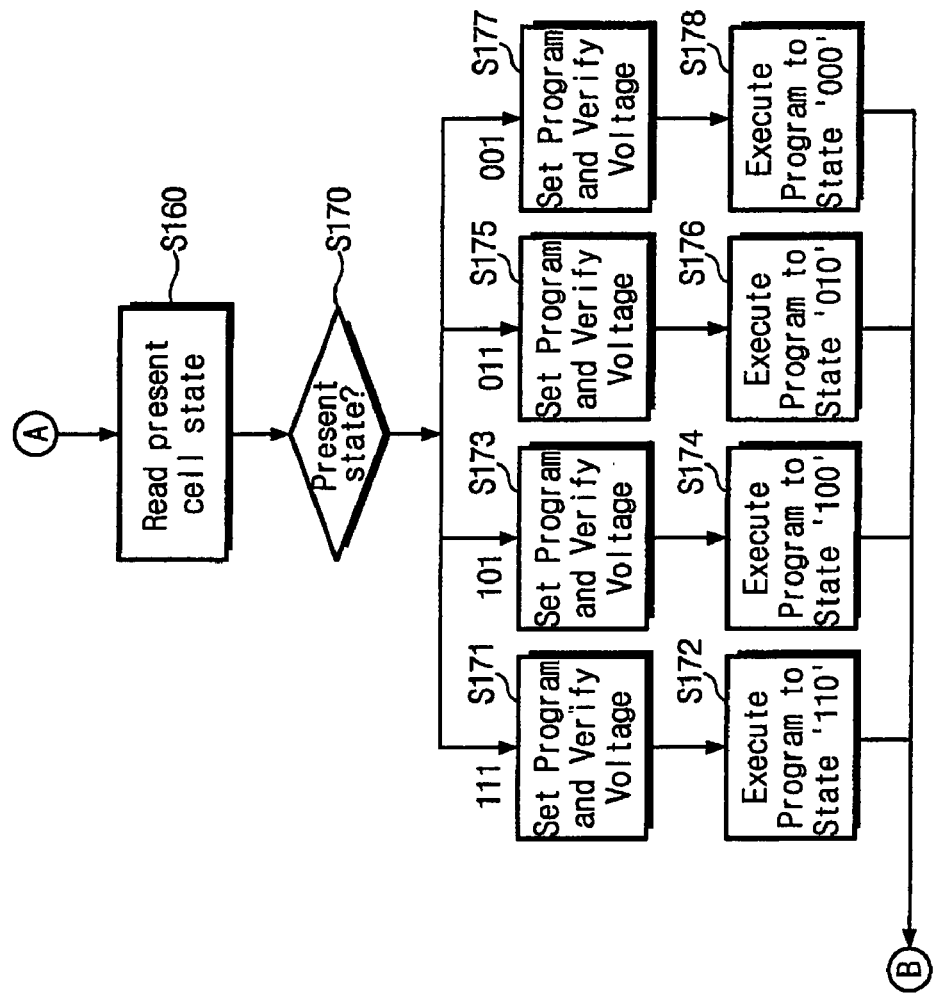

FIG. 9 is a flowchart illustrating a method of programming a 3-bit MLC according to an embodiment of the invention. FIG. 9 is presented in the flowchart portions shown in FIG. 9A and FIG. 9B. Referring to FIG. 9, a three page program operation for page data 3n+2, 3n+1, and 3n associated with a 3-bit MLC flash memory device is shown. Data associated with any one of MSB page (3n+2), second page (3n+1), or LSB page (3n) may be first programmed. Thus, according to the illustrated method, it is possible to implement a 3-bit MLC flash memory device without restriction to a particular page data program sequence.

Upon starting the program illustrated in FIG. 9, program controller 50 (e.g., see, FIG. 5) programs first through third page data according to any program sequence established by the flash memory device manufacturer, the manufacturer of a device incorporating the flash memory device, or an end user. (Hereafter, the entity defining the program sequence will merely be referred to as "the user" without limitation as to the actual commercial disposition of the user).

As shown in FIG. 9, program controller 50 checks a page address associated with the input data (S100). Assuming use of a 3-bit MLC flash memory device, the page address checked will be one of third page address (3n+2), second page address (3n+1), or first page address (3n) (S110).

If a page address PGM_ADD associated with data to be programmed is determined to be the third page address (3n+2), program controller 50 controls sense amplifier 30 and voltage generator 60 to sense or read "present data" stored in the indicated MLC (S120). If the third page data is programmed when the read present data is '111', the MLC cell changes its threshold voltage to correspond to state '5' corresponding to data value '011'. Thus, program controller 50 controls voltage generator 60 to generate program voltage Vpgm and verify voltage Vvfy5 to accomplish a program operation sufficient to change the threshold voltage of the MLC from state '1' to state '5'.

That is voltage generator 60 establishes (or "sets") a start voltage for programming the MLC from state '1' to state '5' in response to various control data and/or signals received from program controller 50. Also, voltage generator 60 generates the verify voltage Vvfy5 for verifying whether the programming of the MLC to state '5' has been properly accomplished (S131). When setting of the program and verify voltages is completed, program controller 50 performs a program operation to state '5'. Program controller 50 then causes the generated program voltage to be applied and subsequently verifies whether the MLC has been programmed to state '5' (S132). This sequence of program and verify steps may be iteratively conducted as is understood in the art.

When it is determined that the present data of the MLC is '110', and if the third page data is programmed, the threshold voltage of the MLC is changed to correspond with state '6' having a data value of '010'. Thus, program controller 50 controls voltage generator 60 to generate a program voltage Vpgm and a verify voltage Vvfy6 for the program operation from state '2' to state '6'. Voltage generator 60 sets a start voltage for programming the MLC from state '2' to state '6' in response to control signals from program controller 50. Also voltage generator 60 generates the verify voltage Vvfy6 for verifying whether the MLC is programmed to state '6' (S133). When setting program and verify voltages is completed, program controller 50 performs the program operation for state '6'. Program controller 50 applies the generated program voltage and then verifies whether the MLC is programmed to state '6' as explained above (S134).

Even when the present data stored in the MLC is '101' or '100', program and verify voltages are each set to program the data with the distribution of a threshold voltage generated when the third page data is programmed (S135 and S137). The MLC is programmed by the set program and verify voltages to have a target threshold voltage (S136 and S138). When transition of the threshold voltage of the MLC to the target threshold voltage is completed by the program operation, programming the third page (or MSB page) data is ended.

If the page address PGM_ADD associated with the data to be programmed is identified as the second page address (3n+1), program controller 50 controls sense amplifier 30 and voltage generator 60 to read the present data of the indicated MLC (S140). When the present data is '111', if the second page data is programmed, the MLC has a threshold voltage corresponding to state '3' having a data value of '101'. Thus, program controller 50 controls a program voltage Vpgm and a verify voltage Vvfy3 for a program operation from state '1' to state '3' (S151). Once setting the program voltage and the verify voltage is completed, program controller 50 performs a program operation to state '3'. Program controller 50 applies the generated program voltage to a wordline of the selected MLC and then verifies whether the MLC is programmed to state '3' (S152). If the present data is '110', '011', or '010', respectively, the threshold voltage of the MLC will be programmed to corresponding data values '100', '001', and '000'. Thus, voltage generator 60 generates a program voltage and a verify voltage to program the MLC to state '4', state '7', or state '8' (S153, S155, and S157), respectively. In this manner, the MLC may be programmed to any target threshold voltage corresponding to a desired state by generating and applying the requisite program and verify voltages (S154, S156, and S158). When the transition of the threshold voltage for the MLC to its identified target is accomplished by the program operation, the program operation of the second page data is ended.

If a page address PGM_ADD of data to be programmed is determined to be second page address (3n), program controller 50 controls sense amplifier 30 and voltage generator 60 to read the present data of the MLC (S160). When the present data is '111', if the second page data is programmed, the MLC has a threshold voltage corresponding to state '2' having an associated data value of '110' (S170). Thus, program controller 50 controls a program voltage Vpgm and a verify voltage Vvfy2 for a program operation from state '1' to state '2' (S171). Once the setting of the program voltage and the verify voltage is completed, program controller 50 performs a program operation to state '2'. Program controller 50 applies the generated program voltage to a wordline of the selected MLC and then verifies whether the MLC is programmed to state '2'

(S172). If the present data is '101', '011', and '001' respectively, the threshold voltage of the MLC must be programmed to data '100', '010', or '000'. Thus, voltage generator 60 generates a program voltage and a verify voltage to program the MLC to state '4', state '6', or state '8' (S174, S176, and S178), respectively. The MLC is to be programmed to target threshold voltage states by the generated program and verify voltages (S174, S176, and S178). When the transition of the threshold voltage of the MLC to the target is completed by the program operation, the program operation of the first page (LSB page) data is ended.

The above-described program method specifies that a MLC may be programmed with a target threshold voltage from a current cell state regardless of which page data is first programmed for multiple data. That is, according to the method of programming 3-bit data according to an embodiment of the invention, it is possible to implement a MLC device without restriction as to program sequence for respective pages during a program operation.

Figure 10A:
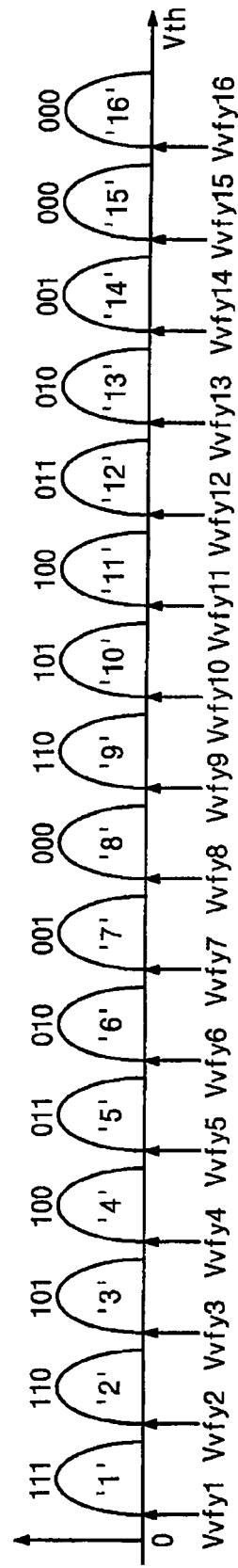
FIG. 10A is a diagram illustrating a threshold voltage distribution and corresponding state assignments for a 4-bit MLC according to the invention.

FIG. 10A is a diagram illustrating a threshold voltage distribution and corresponding state assignments for a 4-bit MLC according to an embodiment of the invention. Referring to FIG. 10A, a MLC of a multi-bit flash memory device storing 4-bit data has a threshold voltage corresponding to one of 16 threshold voltage states. For example, state '1' corresponds to a stored data value of '1111'. Likewise in the illustrated example, state '2', state '3', state '4', ... and state '16' correspond respectively to data values of '1110', '1101', '1100', ... and '0000'.

FIG. 10B is a table illustrating an exemplary address assignment for the respective pages programmed in the 4-bit MLC. Referring to FIG. 10B, each 4-bit flash memory MLC (e.g., cell 0) has a unique physical address. However, the four (4) data bit values associated with each 4-bit flash memory MLC each has one of four logical addresses assigned to it. That is, a first page (i.e., LSB), a second page, a third page, and a fourth page correspond to a logic address of (4n), a logic address of (4n+1), a logic address of (4n+2), and a logic address of (4n+3), respectively. Input/output information (I/O information) associated with each 4-bit flash memory MLC is also assigned.

Figure 11A:
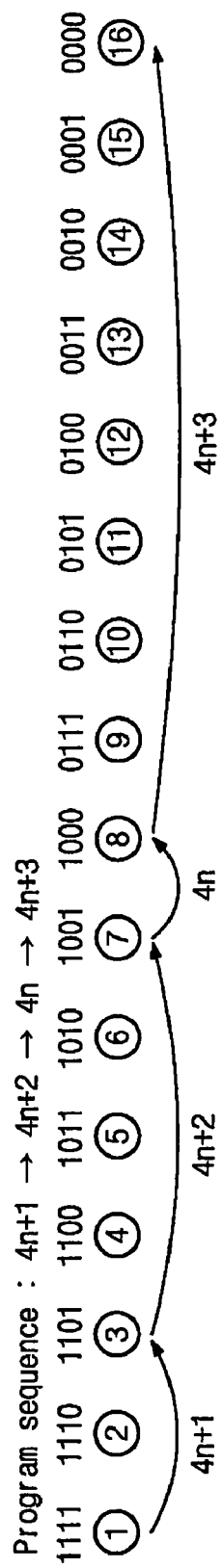
FIG. 11A is a state transition diagram illustrating a method of programming a 4-bit MLC according to an embodiment of the invention.

FIG. 11A is a state transition diagram for a 4-bit MLC programmed in a specific program sequence consistent with one embodiment of the invention. Referring to FIG. 11A, the program sequence is characterized by second page data (4n+1) being programmed first. That is, FIG. 11A illustrates a state transition path for program operation moving from state '1' to state '16' in the following order: a second page (4n+1)→a third page (4n+2)→a first page (4n)→a fourth page (4n+3).

When data of the second page (4n+1) is initially programmed to a 4-bit cell, a threshold voltage transitions from state '1' to state '3', (i.e., the MLC is programmed from '1111' to '1101'). Then, when data of the third page (4n+2) is programmed, the threshold voltage of the MLC transitions from state '3' to state '7', (i.e., the MLC is programmed from '1101' to '1001'). When data of the first page (4n) is then programmed, the threshold voltage of the MLC transitions from state '7' to state '8', (i.e., the MLC is programmed from '1001' to '1000'). And finally, when data of the fourth page or MSB page (4n+3) is programmed, the threshold voltage of the MLC transitions from state '8' to state '16', (i.e., the MLC is programmed from '1000' to '0000').

Figure 11B:
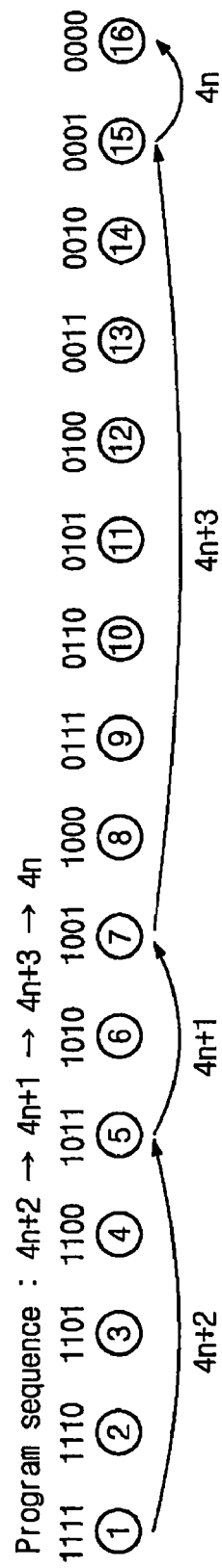
FIG. 11B is a state transition diagram illustrating a method of programming a 4-bit MLC according to another embodiment of the invention.

FIG. 11B is a state transition diagram for the 4-bit MLC as programmed by another program sequence. Referring to FIG. 11B, there is illustrated the state transition when data of the second page (4n+2) is programmed first. That is, FIG. 11A illustrates a state transition path for a program operation that moves from state '1' to state '16' in the following order: a third page (4n+2)→a second page (4n+1)→a fourth page (4n+3)→a first page (4n).

When data of the third page (4n+2) is initially programmed to the 4-bit MLC, the threshold voltage transitions from state '1' to state '5', (i.e., the MLC is programmed from '1111' to '1011'). Then, when data of the second page (4n+1) is programmed, the threshold voltage of the MLC transitions from state '5' to state '7', (i.e., the MLC is programmed from '1011' to '1001'). When data of the fourth page (4n+3) is then programmed, the threshold voltage of the MLC transitions from state '7' to state '15', (i.e., the MLC is programmed from '1001' to '0001'). And finally, when data of the first page or LSB page (4n) is programmed, the threshold voltage of the MLC transitions from state '15' to state '16', (i.e., the MLC is programmed from '0001' to '0000').

Thus, as illustrated above, it is possible to program 4-bit data without restriction as to program sequence.

Figure 12A:
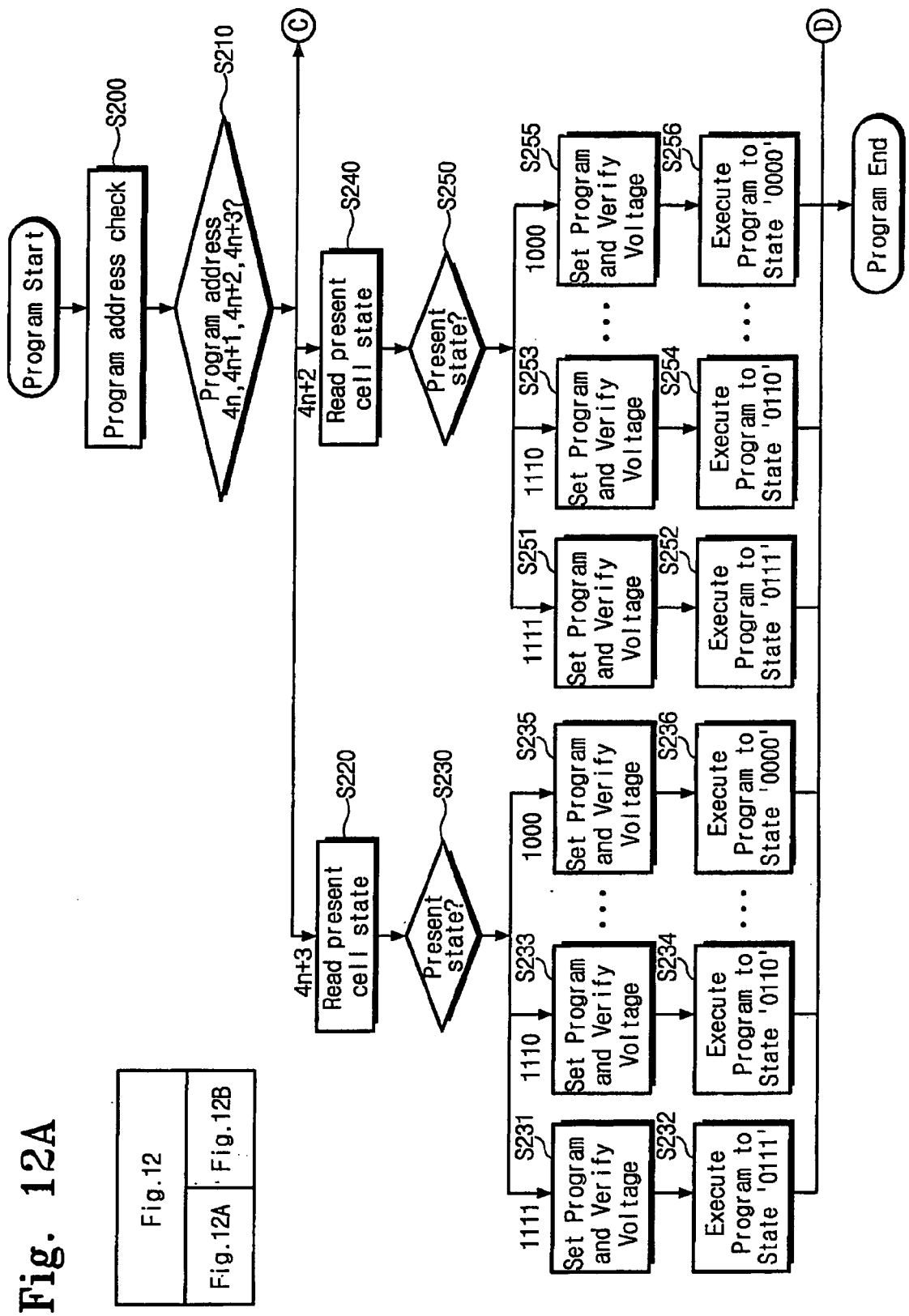
FIGS. 12A and 12B are a flowchart illustrating a method of programming a 4-bit MLC according to an embodiment of the invention.
Figure 12B:
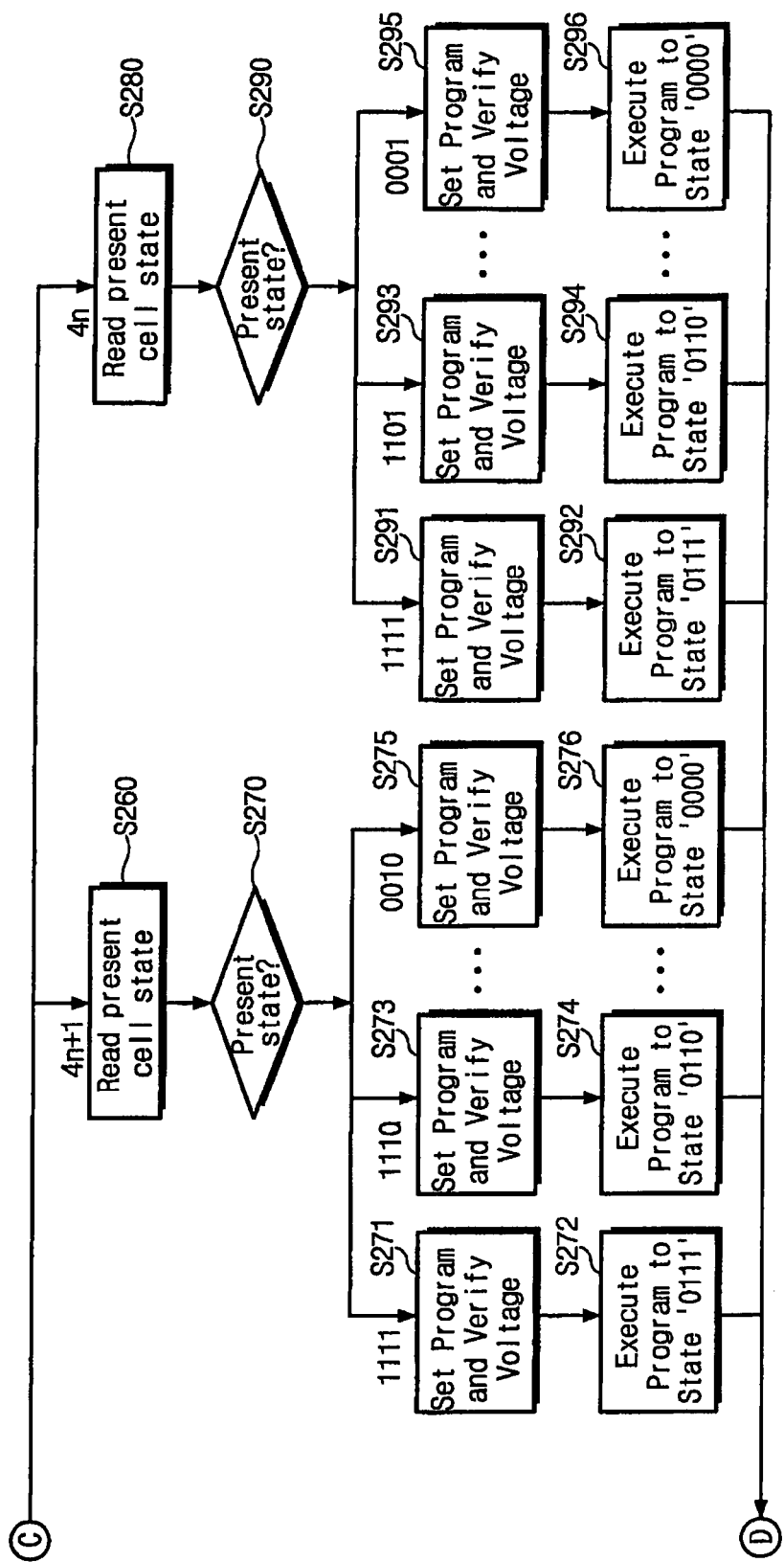

FIG. 12 is a flowchart illustrating a method of programming a 4-bit MLC according to an embodiment of the invention. FIG. 12 is presented in flowchart portions shown in FIGS. 12A and 12B. Referring to FIG. 12, a program operation which first programs any one of pages 4n+3, 4n+2, 4n+1, and 4n associated with a 4-bit MLC flash memory device is shown. That is, data associated with any page may be programmed for the fourth page or MSB page (4n+3), third page (4n+2), second page (4n+1), or first page or LSB page (4n). Thus, a method of programming a 4-bit MLC flash memory device according to an embodiment of the invention makes it possible to implement a 4-bit MLC flash memory device without restriction as to page data program sequence.

When a program illustrated in FIG. 12 starts, program controller 50 performs steps of programming first page data to fourth page data depending on a defined program sequence established by the user. Program controller 50 checks the page address associated with input data (S200). In the assumed case of a 4-bit MLC flash memory device, the detected page address will be one of a fourth page address (4n+3), third page address (4n+2), second page address (4n+1), or first page address (4n) (S210).

If the page address of the data to be programmed is determined to be the fourth page address (4n+3), the method proceeds to step S220 in which the fourth page, i.e., MSB page is programmed. If the page address of the data to be programmed is determined to be the third page address (4n+2), the method proceeds to step S240 in which the third page is programmed. If the page address of the data to be programmed is determined to be the second page address (4n+1), the method proceeds to step S260 in which the second page is programmed. And if the page address of the data to be programmed is determined to be the first page address (4n), the method proceeds to step S280 in which the first page is programmed.

In the S220, stored present data for the MLC is read. Depending on the state of the present data, the method proceeds to respective corresponding steps (S230). If the present data of the MLC is '1111', program controller 50 controls voltage generator 60 to a program voltage Vpgm and a verify voltage Vvfy9 for programming the MLC with data '0111' (231). Once programming the program voltage Vpgm and the verify voltage Vvfy9 is completed, program controller 50 programs the MLC to establish a threshold voltage associated with a data value of '0111' (232). Once iterative program loops for programming the MLC with data '0111' have ended, the program operation of the fourth page data is ended. If the present data of the MLC is '1110', program controller 50 controls voltage generator 60 to generate a program voltage Vpgm and a verify voltage Vvfy10 for programming the MLC with data '0110' (S233). Once setting of the program voltage Vpgm and the verify voltage Vvfy10 is completed, program controller 50 programs the MLC to have a threshold voltage corresponding to data '0110' (S234). The program for the fourth page data (4n+3) may be performed relative to the present data where a logic bit value of a fourth page is '1'. That is, the program operation for the fourth page data may be performed relative to MLCs having data corresponding to a threshold voltage for states '1' through '8'.

The program operation for the third page data (4n+2) starts from step S240 in which present data of the MLC is determined. Depending on the present state of stored data, the method proceeds to corresponding steps (S250). If the present data of the MLC is '1111', program controller 50 controls voltage generator 60 to generate a program voltage Vpgm and a verify voltage Vvfy5 for programming a program cell with data '1011' (S251). Once setting the program voltage Vpgm and the verify voltage Vvfy5 is completed, program controller 50 programs the MLC to a threshold voltage associated with the data '1011' or a threshold voltage associated with state '5' (S252). Once iterative program loops for programming the MLC with data '1011' are completed, the program operation for the third page data is completed. If the present data of the MLC is '1110', program controller 50 controls voltage generator 60 to generate a program voltage Vpgm and a verify voltage Vvfy6 for programming the MLC with data '1010' (S253). Once setting the program voltage Vpgm and the verify voltage Vvfy6 is completed, program controller 50 programs the MLC to a threshold voltage associated with data '1010' or a threshold voltage associated with state '6' (S254). Once iterative program loops for programming the MLC with data '1010' are completed, the program operation for the third page data is completed. The program for the third page data (4n+2) may be performed relative to present data where a logic bit value of the third page is '1'.

The program operation for the second page data (4n+1) starts from step S260 in which present data for the MLC is determined. Depending on the present state of stored data, the method proceeds to corresponding steps (S270). If the present data of the MLC is '1111', program controller 50 controls the voltage generator 60 to generate a program voltage Vpgm and a verify voltage Vvfy3 for programming a program cell with data '1101' (S271). Once setting the program voltage Vpgm and the verify voltage Vvfy3 is completed, program controller 50 programs the MLC to a threshold voltage associated with the data '1101' or a threshold voltage associated with state '3' (S272). Once iterative program loops for programming the MLC with the data '1101' are completed, the program operation for the second page data is completed. If the present data of the MLC is '1110', program controller 50 controls voltage generator 60 to generate a program voltage Vpgm and a verify voltage Vvfy4 for programming the MLC with data '1100' (S273). Once setting the program voltage Vpgm and the verify voltage Vvfy4 is completed, program controller 50 programs the MLC to a threshold voltage associated with the data '1100' or a threshold voltage associated with state '4' (S274). Once iterative program loops for programming the MLC with the data '1100' are completed, the program operation for the third page data is completed. The program for the second page data (4n+1) may be performed relative to present data where a logic bit value of the second page is '1'.

The program operation for the first page data (4n) starts from step S280 in which present data for the MLC is determined. Depending on the present state of stored data, the method proceeds to corresponding steps (S290). If the present data of the MLC is '1111', program controller 50 controls voltage generator 60 to generate a program voltage Vpgm and a verify voltage Vvfy2 for programming a program cell with data '1110' (S291). Once setting the program voltage Vpgm and the verify voltage Vvfy2 is completed, program controller 50 programs the MLC to a threshold voltage associated with the data '1110' or a threshold voltage associated with state '2' (S292). Once iterative program loops for programming the MLC with the data '1110' are completed, the program operation for the first page data is completed. If the present data of the MLC is '1101', program controller 50 controls voltage generator 60 to generate a program voltage Vpgm and a verify voltage Vvfy4 for programming the MLC with data '1100' (S293). Once setting the program voltage Vpgm and the verify voltage Vvfy4 is completed, program controller 50 programs the MLC to a threshold voltage associated with the data '1100' or a threshold voltage associated with state '4' (S294). Once program loops for programming the MLC with the data '1100' are completed, the program operation for the first page data is completed. The program for the second page data (4n) may be performed relative to present data where a logic bit value of the first page is '1'.

According to the above-described method, it is possible to program 4-bit data in a MLC flash memory device without restriction as to program sequence. It is possible to first program any page of the externally provided 4-bit data in accordance with a user's preference.

The foregoing embodiments of the present invention specify method of programming 2-bit, 3-bit and 4-bit data. However, the invention is not limited to only these methods. It may be applied to all multi-bit flash memory devices including multi-level cells where more than 4 bits of data are stored in a single MLC. Moreover, while a NOR-type flash memory device has been described exemplarily, it will be understood by those skilled in the art that the present invention is applied to a NAND-type flash memory device according to the same programming techniques.

The foregoing preferred embodiments are teaching examples. Those of ordinary skill in the art will understand that various changes in form and details may be made to the exemplary embodiments without departing from the scope of the present invention as defined by the following claims.

What is claimed:

1. A method of programming a flash memory device, the method comprising:
programming a selected multi-level memory cell (MLC) with multi-bit data through a plurality of program steps defined by a program sequence, wherein the data to be stored in the selected MLC during a current program step is determined in accordance with current data stored in the MLC and the current program step, and an order of the plurality of program steps defining the program sequence is arbitrarily determined during the programming of the multi-bit data.

2. The method of claim 1, wherein each one of the plurality of program steps respectively programs one bit of the multi-bit data.

3. The method of claim 2, wherein the current program step is defined by a plurality of addresses each corresponding to one bit of the multi-bit data.

4. The method of claim 3, wherein the current program step comprises:
determining an address for a bit to be programmed during the current program step;
reading current data stored in the selected MLC; and
determining target data in accordance with the address and current data stored in the selected MLC.

5. The method of claim 4, wherein the current program step further comprises:

generating a program voltage and a verify voltage for programming the selected MLC to have a threshold voltage corresponding to the target data; and supplying the program voltage and the verify voltage to a wordline associated with the selected MLC.

6. The method of claim 5, wherein the steps of generating the program and verify voltages and supplying the program and verify voltages are repeatedly and iteratively performed.

7. A flash memory device storing multi-bit data, comprising:

a voltage generator configured to generate voltages for programming a multi-level memory cell (MLC) with a target threshold voltage in response to a state selection signal and apply the program voltage to the MLC;

a read/write circuit configured to write data to the MLC and read current data stored in the MLC;

a program controller configured to determine target data to be stored in the MLC in accordance with the current data and a program address for data to be programmed to the MLC, and generate the state selection signal for programming the memory cell with the threshold voltage corresponding to the target data, wherein the program address is provided in relation to any one bit of the multi-bit data without restriction as to page data program sequence.

8. The flash memory device of claim 7, wherein the multi-bit data correspond to respective distributions of a threshold voltage in the following order: '11', '10', '01', and '00'.

9. The flash memory device of claim 7, wherein the multi-bit data correspond to respective distributions of a threshold voltage in the following order: '111', '110', '101', '100', '011', '010', '001' and '000'.

10. The flash memory device of claim 7, wherein the multi-bit data correspond to respective distributions of a threshold voltage in the following order: '1111', '1110', '1101', '1100', '1011', '1010', '1001', '1000', '0111', '0110', '0101', '0100', '0011', '0010', '0001', and '0000'.

11. The flash memory device of claim 7, wherein voltages for programming the MLC with a target threshold voltage includes a program voltage and a verify voltage corresponding to the target threshold voltage.

12. The flash memory device of claim 11, wherein the program voltage has a start voltage corresponding to current data stored in the MLC.

13. The flash memory device of claim 12, wherein the verify voltage is a wordline voltage corresponding to the target data.

14. The flash memory device of claim 7, wherein the program controller performs program loops iteratively until the MLC has been programmed to the target data.

15. The flash memory device of claim 7, wherein the program address is a page address corresponding to an individual bit of the multi-bit data.

16. The flash memory device of claim 7, wherein the MLC is a NOR-type flash memory cell or a NAN D-type flash memory cell.

17. A method of programming a multi-bit flash memory device where multi-bit data is stored in a single multi-level memory cell (MLC), the method comprising:

determining an address associated with one bit of the multi-bit data to be programmed;

reading current data stored in the MLC;

determining target data in accordance with the address and the current data;

generating a program voltage and a verify voltage for programming the MLC to a threshold voltage corresponding to the target data; and applying the program voltage and the verify voltage to a wordline associated with the MLC, wherein the address is randomly selected to program the one bit of the multi-bit data.

18. The method of claim 17, wherein the multi-bit data has a 2-bit size, a 3-bit size, or a 4-bit size.

19. The method of claim 18, wherein the multi-bit data correspond to respective distributions of a threshold voltage in the following order: '11', '10', '01', and '00'.

20. The method of claim 18, wherein the multi-bit data correspond to respective distributions of a threshold voltage in the following order: '111', '110', '101', '100', '011', '010', '001' and '000'.

21. The method of claim 18, wherein the multi-bit data correspond to respective distributions of a threshold voltage in the following order: '1111', '1110', '1101', '1100', '1011', '1010', '1001', '1000', '0111', '0110', '0101', '0100', '0011', '0010', '0001', and '0000'.

* * * * *